United States Patent

[11] 3,624,314

[72] Inventor Earl L. Mantor
Chicago, Ill.
[21] Appl. No. 25,640
[22] Filed Apr. 6, 1970
[45] Patented Nov. 30, 1971
[73] Assignee Admiral Corporation
Chicago, Ill.

[54] COMPLEMENTARY SYMMETRY AMPLIFIER WITH FIELD-EFFECT TRANSISTOR DRIVER
7 Claims, 2 Drawing Figs.

[52] U.S. Cl. 179/100.4 A, 179/1 A, 307/156, 330/35
[51] Int. Cl. G11b 3/00, H04m 1/60, H03f 3/16
[50] Field of Search 179/100.4 A, 100.4 ST, 1 A, 1 G; 330/13, 22, 35; 307/156

[56] References Cited

UNITED STATES PATENTS

| | | | |
|---|---|---|---|
| 3,210,677 | 10/1965 | Lin | 330/35 |
| 3,300,585 | 1/1967 | Reedyk | 179/1 A |
| 3,341,723 | 9/1967 | Tourtellot | 307/156 |
| 3,365,545 | 1/1968 | Petrie | 179/1 A |
| 3,424,992 | 1/1969 | Zielinski | 330/13 |

*Primary Examiner*—Bernard Konick
*Assistant Examiner*—Raymond F. Cardillo, Jr.
*Attorney*—Nicholas A. Camasto ABSTRACT: An amplifier with a pair of complementary symmetry connected output transistors driven by an N-channel field-effect transistor whose load includes the bias resistor for the output transistors.

INVENTOR

EARL L. MANTOR

BY Nicholas A Camasto

ATTORNEYS

COMPLEMENTARY SYMMETRY AMPLIFIER WITH FIELD-EFFECT TRANSISTOR DRIVER

BACKGROUND OF THE INVENTION

This invention relates to transistor amplifiers and particularly to transistor amplifiers used in low-cost phono applications. Prior art amplifiers of this type have generally consisted of a pair of complementary symmetry output transistors driven by an input transistor having numerous other circuit components required to maintain proper bias on the output transistors. Normally, such amplifiers incorporate control diodes to maintain proper bias on the output stages as well as some type of temperature compensation to prevent thermal runaway. These amplifiers are also subject to line voltage variations which may cause crossover distortion at one extreme and thermal runaway at the other.

SUMMARY OF THE INVENTION

The preferred form of the invention utilizes a field-effect transistor, hereinafter referred to as an FET, for both a driving source for the complementary symmetry connected output transistors and a bias control therefor. The characteristics of an FET, i.e., the relationship between output current, source voltage and bias voltage are such that the device makes good constant current source (similar to a pentode vacuum tube). Its thermal properties are also valuable in the overall circuit design. By placing the bias resistor for the complementary symmetry output transistors in the FET output circuit, a constant bias voltage may be maintained. Further, by making the bias on the FET independent of the line voltage, the FET is rendered insensitive to line voltage variations. Also a simple capacitor DC filter may be used with further cost savings because of this insensitivity to line variations.

Accordingly, a principal object of this invention is to provide a novel, low-cost amplifier.

A further object of this invention is to provide a complementary symmetry connected transistor circuit driven by an FET whose output load includes the bias resistor for the transistors.

Another object of this invention is to provide a low-cost phono amplifier utilizing an N-channel FET between a phonograph cartridge and a pair of complementary symmetry connected transistors.

DESCRIPTION OF THE PREFERRED EMBODIMENT

Figures 1, 2:
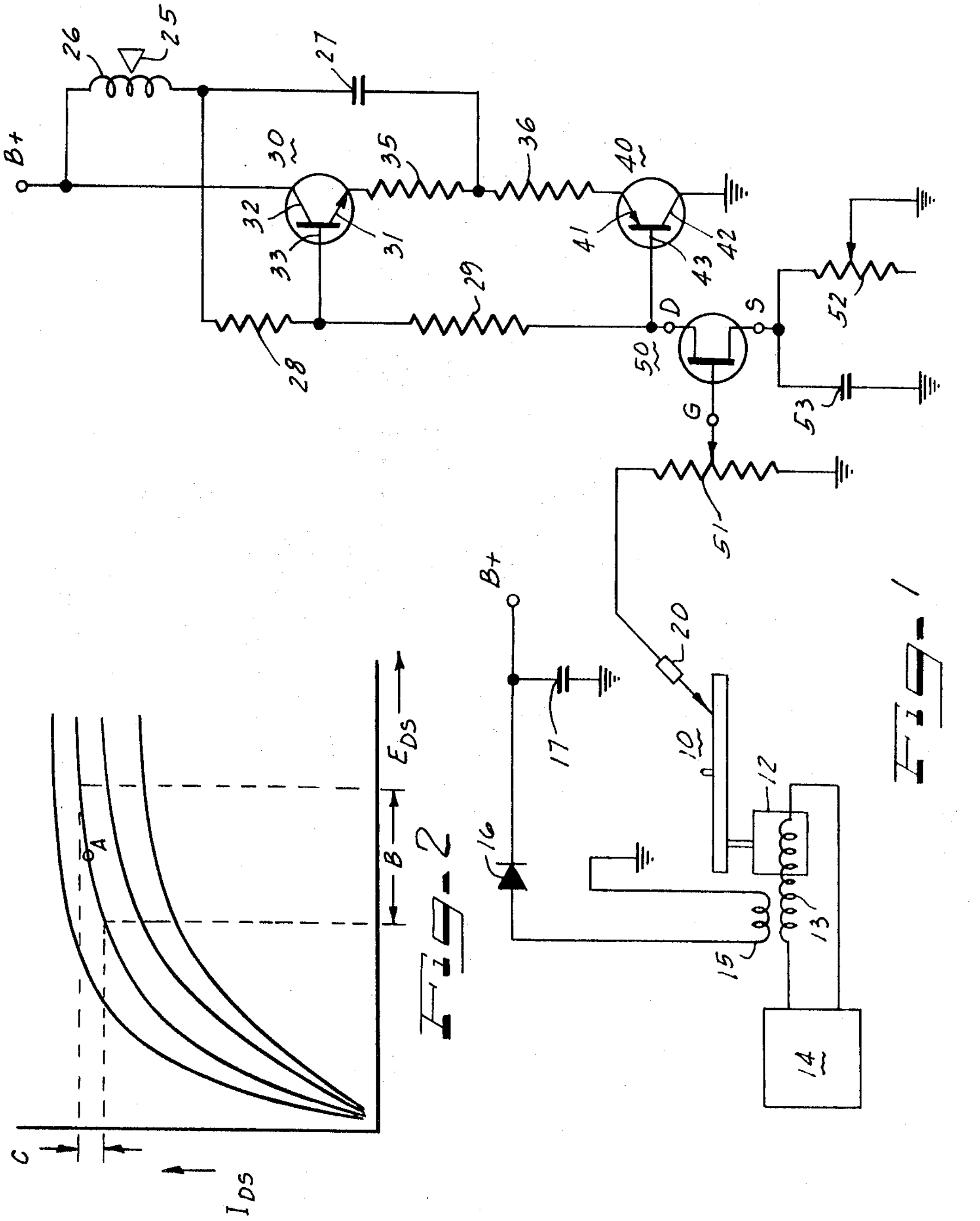
FIG. 1 of the drawing comprises a schematic representation of a low-cost phono amplifier embodying the teachings of the invention.
FIG. 2 depicts the output current ($I_{DS}$) versus operating voltage ($E_{DS}$) characteristic for differing FET bias voltages.

FIG. 1 discloses a phonograph 10 having a turntable 11 driven by a motor 12 having an energizing winding 13 connected to a source of AC power 14. A separate winding 15 is inductively coupled to motor winding 13, and the voltage developed thereacross is fed to a diode 16 for rectification. The output of diode 16 is filtered in capacitor 17. A low-cost, low-voltage DC source B+ is thus established.

A pair of transistors 30 and 40 are connected in complementary symmetry fashion with emitter 31 of transistor 30 connected, through a pair of small stabilizing resistors 35 and 36, to emitter 41 of transistor 40. Collector 32 of transistor 30 is connected to the previously mentioned B+ source and collector 42 of transistor 40 is connected to ground. The junction of resistor 35 and 36 is connected to an electrolytic capacitor 27, the other terminal of which is connected to voice coil 26 of a permanent magnet type speaker 25. The other end of voice coil 26 is connected to B+.

The bias network for the output transistors consists of a resistor 28 connected to the junction of capacitor 27 and voice coil 26, a bias resistor 29 and the output terminals of FET 50. Resistor 28 is connected in series with bias resistor 29, which in turn is connected to the drain terminal D of FET 50. As seen in the drawing, bias resistor 29 is connected to the respective bases 33 and 43 of transistors 30 and 40. Completing the bias circuit is the source terminal S of FET 50 and the parallel combination of a capacitor 53 and a variable resistor 52.

The input circuit for FET 50 comprises a potentiometer 51, the movable arm of which is connected to gate terminal G, fed from a cartridge 20 driven by a record (not shown) on turntable 11. It will be appreciated that various tone compensation circuits may be used in conjunction with potentiometer 51 which functions as a signal gain control.

Transistors 30 and 40 are seen to be of opposite conductivity, that is, transistor 30 is of the NPN-type and transistor 40 of the PNP-type. The complementary symmetry arrangement of these transistors is conventional and the means by which the transistors share in driving loudspeaker 25 is well known in the art. It is also well known that complementary symmetry connected transistors must be properly biased to prevent crossover distortion.

This bias is produced by the voltage drop across bias resistor 29. Due to the nature of FET 50 (as will be seen later), the drain to source current is relatively insensitive to changes in the drain to source voltage for a given bias condition. Accordingly, establishment of a bias on FET 50 gives rise to an output current which is, for all practical purposes, constant. This constant output current traverses bias resistor 29 and provides a substantially constant bias on the complementary symmetry connected transistors. The proper or desired bias on the output transistors is obtained by selecting the bias applied to the FET through the medium of variable resistor 52. As will be apparent to those skilled in the art, the current flow through variable resistor 52 establishes a voltage at terminal S which determines the bias from G to S on FET 50. Since the bias is dependent upon $I_{DS}$ of FET 50, and $I_{DS}$ is independent of line changes, the bias is also independent of line variations.

Referring to FIG. 2, there is shown a plot $I_{DS}$ (drain to source current) versus $E_{DS}$ (drain to source voltage) for differing bias voltages. Assume the operating point for FET 50 is selected at point A. A wide variation (B) in source voltage can be tolerated with very little change (C) in source current. The magnitude of the drain to source current is controllable by selecting the bias voltage on the FET. Hence, it may be readily seen that the bias voltage on the complementary symmetry transistors may be established by selection of bias resistor 29 and the bias on FET 50.

Those skilled in the art will note from the connections of FET 50 that it is of the N-channel type. Using an N-channel FET yields an added advantage in that automatic temperature compensation is obtained for prevention of thermal runaway. For the silicon-type output transistors used, an increase in ambient temperature manifests itself in greater base to emitter current flow which, if unchecked, would soon lead to thermal runaway and ultimate destruction of the transistor junction. The N-channel FET has a negative temperature characteristic, which means its drain to source current decreases with temperature rise and reduces the bias on the output transistors, which, by reducing their forward bias, tends to maintain their stability by preventing the possibility of thermal runaway.

It will be seen that cartridge 20 drives FET 50 without the need for impedance matching networks. This is due to the fact that FET 50 has a high input impedance and a frequency response characteristic allowing it to work properly from a ceramic cartridge.

The embodiments of the invention in which an exclusive property or privilege is claimed are defined as follows:

1. A complementary symmetry amplifier comprising: a pair of transistors of opposite conductivity type; a loudspeaker drivingly interconnecting the inputs of said transistors; a bias resistor interconnecting the inputs of said transistors; and signal driving means maintaining substantially constant DC current through said bias resistor; said signal driving means including, an FET having its output connected in series with said bias resistor and its input coupled to a source of audio signal, and means establishing the operating point for said FET at a point of substantially zero slope on its output current/source voltage characteristic curve.

2. The amplifier of claim 1 further comprising a volume control coupled between the input of said FET and said source of audio signal.

3. The amplifier of claim 2 wherein said last-mentioned means includes a variable resistance and signal bypass capacitor.

4. The amplifier of claim 3 wherein said output includes the drain and source terminals of said FET and said input includes the gate and source terminals.

5. A low-cost phonograph comprising: a motor-driven turntable adapted to rotatably support a phonograph record; a pickup producing an electrical signal from said record; a power winding on said motor; rectifying means producing a low voltage source of DC power from said power winding; a loudspeaker; a pair of transistors of opposite conductivity type connected in complementary symmetry fashion for driving said loudspeaker; a bias resistor connected across the inputs of said transistors; an FET including an output circuit and an input circuit; means serially connecting said output circuit, said bias resistor and said DC source; means coupling said electrical signal to said input circuit; and means for adjusting the output circuit quiescent current flow through said FET for properly biasing said transistors.

6. The phonograph of claim 5 wherein said last-mentioned means comprises a variable resistance and a signal bypass capacitor.

7. The phonograph of claim 5 wherein said FET has drain, source and gate terminals and wherein said drain and source terminals comprise said output circuit said gate and source terminals comprise said input circuit.

* * * * *